US005801601A

United States Patent [19]
Gayle

[11] Patent Number: 5,801,601
[45] Date of Patent: Sep. 1, 1998

[54] RADIO FREQUENCY DELAY LINE ADJUSTMENT CIRCUIT

[75] Inventor: Christopher R. Gayle, Arlington, Mass.

[73] Assignee: Lucent Technologies Inc., Murray Hill, N.J.

[21] Appl. No.: 789,749

[22] Filed: Jan. 27, 1997

[51] Int. Cl.⁶ .................................................. H01P 1/18
[52] U.S. Cl. ........................................ 333/156; 333/161
[58] Field of Search ................................ 333/156, 161, 333/164, 138–140

[56] References Cited

U.S. PATENT DOCUMENTS

| | | | |
|---|---|---|---|
| 4,616,196 | 10/1986 | Sharma | 333/161 |
| 4,821,005 | 4/1989 | Kling | 333/189 |
| 4,965,866 | 10/1990 | Martineau | 333/161 X |
| 5,339,056 | 8/1994 | Kaneko et al. | 333/156 X |
| 5,424,696 | 6/1995 | Nakahara et al. | 333/161 X |

FOREIGN PATENT DOCUMENTS

| | | | |
|---|---|---|---|
| 60-46606 | 3/1985 | Japan | 333/161 |
| 0082801 | 4/1989 | Japan | 333/161 |
| 1580459 | 7/1990 | U.S.S.R. | 333/156 |

*Primary Examiner*—Seungsook Ham

[57] ABSTRACT

A printed circuit board with a microstrip radio frequency delay line deposited thereon. In addition, a plurality of delay line segments are deposited on the board in close proximity to one end of the delay line. To achieve an overall desired delay length, one of the delay line segments is selected and serially inserted in circuit with the delay line by populating a surface mount circuit element between terminals at the ends of the delay line and the selected delay line segment.

4 Claims, 3 Drawing Sheets

RADIO FREQUENCY DELAY LINE ADJUSTMENT CIRCUIT

BACKGROUND OF THE INVENTION

This invention relates to radio frequency delay lines and, more particularly, to such delay lines formed as microstrip printed circuits and an arrangement for fine tune adjusting the length of such a delay line.

Radio frequency delay lines are typically implemented by microstrip deposition on a printed circuit board. As a result of the manufacturing process, the actual delay produced by the delay line is accurate within a certain tolerance. The delay line must operate with other circuitry, which has its own values within certain tolerances. Therefore, to make the overall system operate within required specifications, it would be desirable to provide fine tuning adjustability to the delay line.

It would also be desirable to be able to utilize a single printed circuit board for a plurality of applications, wherein each application utilizes the same circuitry, but requires a unique length delay line.

SUMMARY OF THE INVENTION

According to the present invention, there is provided radio frequency variable length delay line circuitry comprising a substrate and a circuit path on the substrate. The circuit path has a gap and a respective one of a pair of circuit path terminals on each side of the gap. A plurality of radio frequency delay line segments are provided on the substrate, with each of the segments being terminated at each of its ends by a respective delay line terminal associated with and in close proximity to a respective one of the circuit path terminals. The circuitry further includes means directly connecting the delay line terminals of exactly one of the plurality of delay line segments to the associated circuit path terminals so as to bridge the circuit path gap with that one delay line segment.

In accordance with an aspect of this invention, a method for adjusting the delay provided by a fixed length microstrip radio frequency delay line on a substrate to a desired delay comprises the steps of depositing a plurality of microstrip radio frequency delay line segments on the substrate with one end of each of the segments being spaced from one end of the delay line, the spacing between the delay line one end and each of the segment one ends being substantially equal. One of the segments is selected, that segment being the one which together with the delay line provides a total delay equal to the desired delay, and the delay line one end is then connected to the one end of the selected segment.

BRIEF DESCRIPTION OF THE DRAWINGS

The foregoing will be more readily apparent upon reading the following description in conjunction with the drawings in which like elements in different figures thereof are identified by the same reference numeral and wherein.

DETAILED DESCRIPTION

Figure 1:
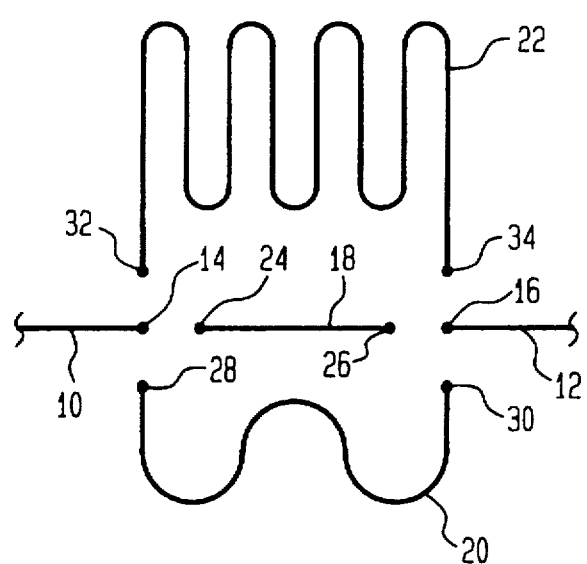
FIG. 1 is a conceptual circuit schematic diagram useful in understanding the principles of this invention.

As shown in FIG. 1, a circuit path having segments 10, 12, has a gap between the segments 10, 12. The segment 10 is terminated by a terminal 14 on one side of the gap and the segment 12 is terminated by a terminal 16 on the other side of the gap. In the embodiment shown in FIGS. 2 and 3, to be described in full detail hereinafter, one of the segments 10, 12 comprises a microstrip radio frequency delay line and the gap between the terminals 14, 16 separates one end of the delay line from other circuitry, represented by the other segment 12, 10.

According to the present invention, the gap between the terminals 14, 16 is bridged by a selected one of a plurality of delay line segments. Illustratively, the delay line segments include a relatively short segment 18, a medium length segment 20, and a relatively long length segment 22. The present invention has particular utility to circuitry mounted on a substrate wherein radio frequency delay lines are microstrip depositions on the substrate. Thus, the delay line segments 18, 20, 22, as well as the circuit path segments 10, 12 are all illustratively such microstrip depositions.

The delay line segment 18 is terminated by the terminals 24, 26; the delay line segment 20 is terminated by the terminals 28, 30; and the delay line segment 22 is terminated by the terminals 32, 34. As shown, each of the terminals 24, 28, 32 is associated with and in close proximity to the terminal 14, and each of the terminals 26, 30, 34 is associated with and in close proximity to the terminal 16. Preferably, the spacing between each of the circuit path segment terminals 14, 16 and its associated delay line segment terminals is substantially equal.

In a first scenario, during testing of the circuitry including the segments 10, 12 during the development process to insure that the circuitry meets the required specifications, one of the adjustments is to the length of the radio frequency delay line. Toward that end, the fixed length microstrip radio frequency delay line deposited on the substrate, which includes one or both of the circuit path segments 10, 12, is made slightly shorter than is required. Then, one of the delay line segments 18, 20, 22 is selected to increase the length of the delay line so that the overall circuitry meets the specifications. To add the selected delay line segment to the circuit path, a jumper is provided between the terminal 14 and the one of the terminals 24, 28, 32 associated with the selected delay line segment. Similarly, another jumper is provided between the terminal 16 and the one of the terminals 26, 30, 34 associated with the selected delay line segment. This jumper may be deposited directly on the substrate and comprises a circuit element having negligible impedance to radio frequency signals such as, for example, a zero ohm surface mount resistor.

Figure 2:
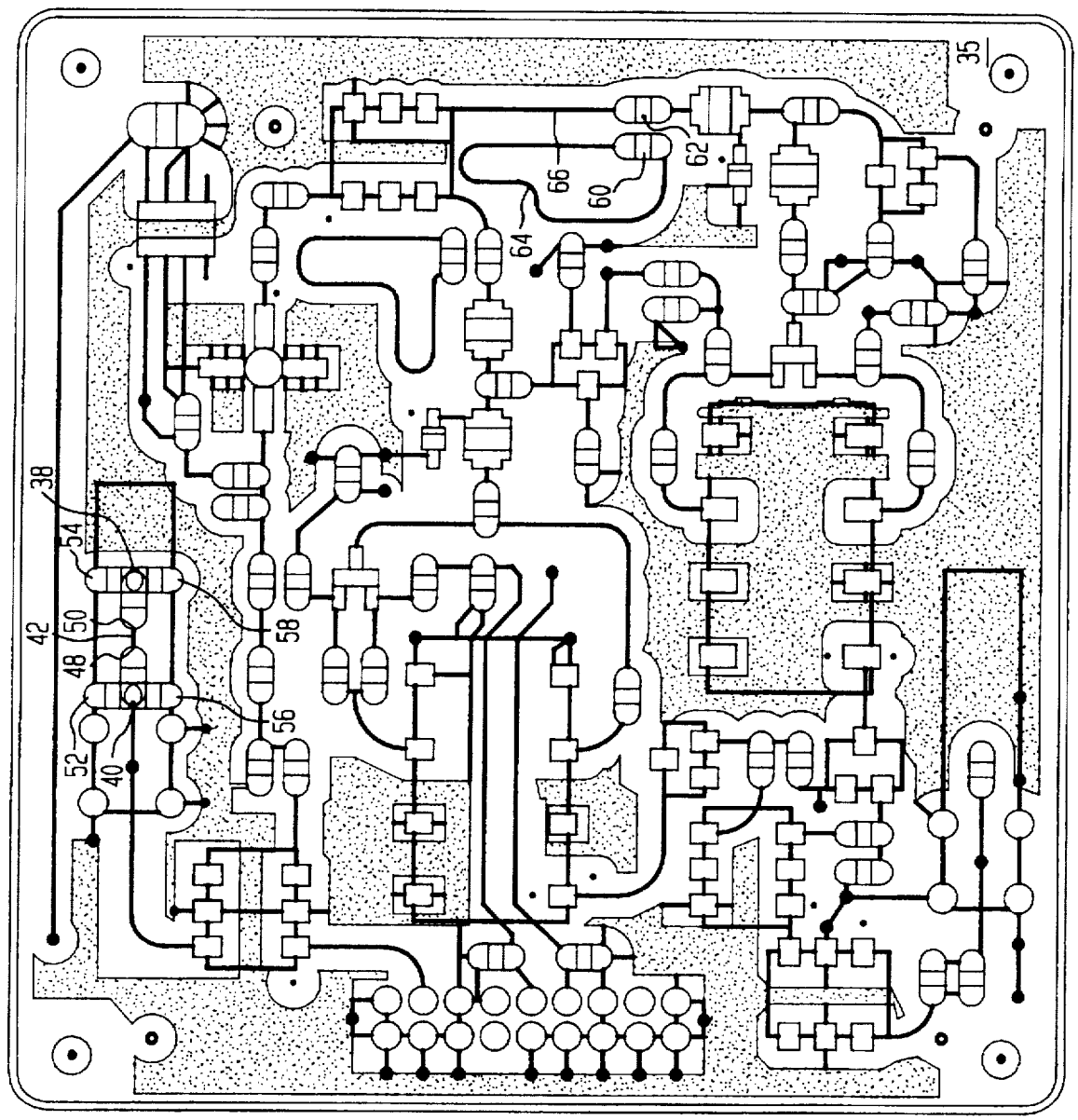
FIG. 2 illustrates a top side of a layer of a printed circuit substrate showing an illustrative embodiment of the present invention.
Figure 3:
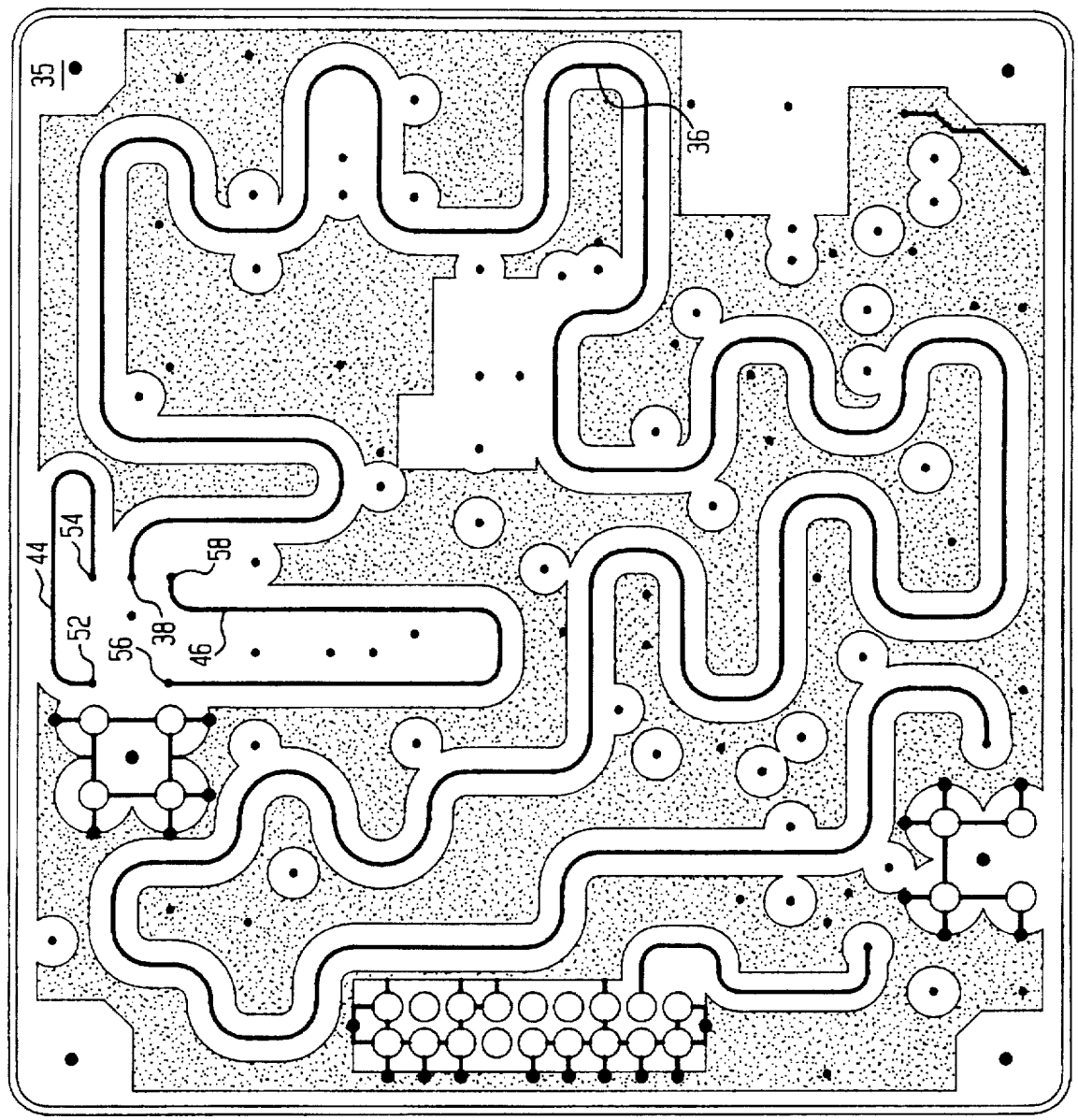
FIG. 3 is a reverse image of the bottom side of the layer shown in FIG. 2.

FIGS. 2 and 3 illustrate opposed layers, viewed from the same side, of a printed circuit substrate 35 of a predistortion circuit for radio frequency signals before their conversion to optical signals, with FIG. 2 showing the top side of the layer and FIG. 3 showing the bottom side of the layer. In FIG. 2, all possible surface mount circuit elements are shown as being populated, it being understood that at the ends of the delay line segments, only one pair of surface mount circuit elements would actually be populated to insert only one delay line segment into the circuit path, as will be described. As shown in FIG. 3, on the bottom side of the layer there is deposited a microstrip radio frequency delay line 36 having a terminal 38 at one end thereof. The terminal 38 is separated from the terminal 40 (FIG. 2) by a gap which is to be filled by one and only one of the microstrip delay line segments 42, 44, 46 which are deposited on the printed circuit board (substrate) 35. Thus, the delay line segment 42 is terminated by the terminals 48, 50; the delay line segment 44 is terminated by the terminals 52, 54; and the delay line segment 46 is terminated by the terminals 56, 58. In the illustrative embodiment, the terminals 38, 52, 54, 56, 58 extend through both sides of the printed circuit board 35, so that connections to those terminals can be made from either side of the board.

Preferably, zero ohm surface mount resistors are utilized to interconnect the selected ones of the terminals. Thus, if it is desired to utilize the delay line segment 42, a surface mount resistor is utilized to populate the gap between the terminals 40 and 48 and another surface mount resistor is utilized to populate the gap between the terminals 38 and 50. Similarly, if it desired to utilize the delay line segment 44, surface mount resistors are utilized to populate the gap between the terminals 40 and 52 and the gap between the terminals 38 and 54. Finally, if it is desired to utilize the delay line segment 46, surface mount resistors are utilized to populate the gap between the terminals 40 and 56 and the gap between the terminals 38 and 58. Although zero ohm surface mount resistors are utilized in the illustrative embodiment, it is also possible to bridge the gaps by utilizing other elements, such as surface mount capacitors.

A variant of the foregoing is shown in FIG. 2 where the surface mount elements 60, 62 can be populated at 90° to the direction shown to incorporate the circuit loop 64 into the circuit path 66.

As described, the foregoing arrangement can be used with several scenarios to provide improved economy of design. In a second scenario, the printed circuit board 35 is utilized in a system having three variants, each of which requires a different delay length. Thus, a single printed circuit board can be provided and, depending upon which variant a particular board is to be used with, the desired delay length is achieved by populating a specific pair of surface mount resistors. In another scenario, the circuit board is to be used in only one type of system, but the specific delay line length is not known until the circuit board is tested with the other components of the system. At that time, it is determined what the appropriate delay line length is, and then all of the boards are populated with surface mount resistors bridging the same pair of gaps. In all scenarios, only a single printed circuit board design is required to obtain a number of different delay lengths, resulting in manufacturing savings.

Accordingly, there has been disclosed improved radio frequency adjustable delay line circuitry. While a preferred embodiment of the present invention has been disclosed herein, it is understood that various modifications and adaptations to the disclosed embodiment will be apparent to one of ordinary skill in the art and it is intended that this invention be limited only by the scope of the appended claims.

What is claimed is:

1. Radio frequency variable length delay line circuitry comprising:

a substrate;

a circuit path on said substrate, said circuit path having a gap and a respective one of a pair of circuit path terminals on each side of said gap;

a plurality of radio frequency delay line segments formed as microstrip printed circuits on said substrate, each of said segments being terminated at each of its ends by a respective delay line terminal associated with and in close proximity to a respective one of said circuit path terminals; and surface mount circuit elements selectively populated on said substrate wherein each of said surface mount circuit elements has a passive circuit element portion with conductive leads at the opposite ends of said passive circuit element portion, said conductive leads connecting the delay line terminals of exactly one of said plurality of delay line segments to the associated circuit path terminals so as to bridge the circuit path gap with said one delay line segment.

2. The circuitry according to claim 1 wherein said surface mount circuit elements comprise zero ohm surface mount resistors.

3. The circuitry according to claim 1 wherein at least part of said circuit path is a fixed length radio frequency delay line.

4. A method for adjusting the delay provided by a fixed length microstrip radio frequency delay line on a substrate to a desired delay, comprising the steps of:

depositing a plurality of microstrip radio frequency delay line segments on said substrate with one end of each of said segments being spaced from one end of said delay line, the spacing between said delay line one end and each of said segment one ends being substantially equal;

selecting one of said delay line segments which together with said delay line provides a total delay equal to said desired delay; providing a surface mount circuit element having a passive circuit element portion with conductive leads at opposite ends of said passive circuit element portion; and populating said surface mount circuit element only in the space between said delay line one end and said one end of said selected delay line segment to connect said delay line one end to said one end of said selected delay line segment via respective conductive leads.

* * * * *